United States Patent
Mate

(10) Patent No.: US 9,723,405 B2
(45) Date of Patent: Aug. 1, 2017

(54) ATTENUATING AN INPUT SIGNAL

(71) Applicant: Red Lion 49 Limited, Kidlington Oxford, Oxfordshire (GB)

(72) Inventor: David Joseph Mate, Long Compton (GB)

(73) Assignee: Red Lion 49 Limited, Begbroke, Kidlington Oxford (GB)

( * ) Notice: Subject to any disclaimer, the term of this patent is extended or adjusted under 35 U.S.C. 154(b) by 0 days.

(21) Appl. No.: 15/246,373

(22) Filed: Aug. 24, 2016

(65) Prior Publication Data
US 2017/0064447 A1  Mar. 2, 2017

(30) Foreign Application Priority Data

Aug. 27, 2015  (GB) .................................. 1515200.2

(51) Int. Cl.
| | |
|---|---|
| H04R 3/04 | (2006.01) |
| H03F 3/45 | (2006.01) |
| H03F 3/187 | (2006.01) |
| H03G 1/00 | (2006.01) |
| H03H 11/24 | (2006.01) |

(52) U.S. Cl.
CPC ............... *H04R 3/04* (2013.01); *H03F 3/187* (2013.01); *H03F 3/45071* (2013.01); *H03G 1/0005* (2013.01); *H03H 11/245* (2013.01); *H03F 2200/03* (2013.01); *H03F 2200/165* (2013.01); *H03G 2201/106* (2013.01)

(58) Field of Classification Search
CPC ....... H04R 3/04; H03F 3/187; H03F 3/45071; H03F 2200/03; H03F 2200/165; H03G 1/0005; H03G 2201/106; H03H 11/245
USPC ................... 381/94.1, 94.5, 94.6, 94.8, 106
See application file for complete search history.

(56) References Cited

U.S. PATENT DOCUMENTS 3,862,367 A * 1/1975 Kono ................... H03F 3/1855
                                                        330/264

FOREIGN PATENT DOCUMENTS

| DE | 102012103403 A1 | 10/2013 |
|---|---|---|
| EP | 2372907 A2 | 10/2011 |
| GB | 2502122 A | 11/2013 |
| JP | 09-74333 A | 3/1997 |
| WO | 01/13513 A1 | 2/2001 |

* cited by examiner

Primary Examiner — David Ton
(74) Attorney, Agent, or Firm — Richard M. Goldberg

(57) ABSTRACT

Apparatus (301) for switchable attenuation of a differential input signal from a microphone includes positive and negative non-attenuating paths (406, 410) have n- and p-type MOSFETs (421, 422, 423, 424) in back-to-back configurations; positive and negative attenuating paths (405, 409) have n- and p-type MOSFETs (415, 416, 418, 419) in back-to-back configurations in combination with resistors; a gate driver (425) applies a drive signal of one polarity (QNEG) to gates of the n-type MOSFETs in the attenuating paths and the p-type MOSFETs in the non-attenuating paths, and a drive signal of opposite polarity (QPOS) to the gates of the p-type MOSFETs in the attenuating paths and the n-type MOSFETs in the non-attenuating paths; and the state of the MOSFETs depends on the drive signals at their gates, and thus the input signal may be routed via either the non-attenuating paths or the attenuating paths by controlling the drive signals.

13 Claims, 10 Drawing Sheets

US 9,723,405 B2

ATTENUATING AN INPUT SIGNAL

CROSS REFERENCE TO RELATED APPLICATIONS

This application claims priority from United Kingdom Patent Application No 15 15 200.2 filed on Aug. 27, 2015, the whole contents of which are incorporated herein by reference in their entirety.

BACKGROUND OF THE INVENTION

1. Field of the Invention

The present invention relates to apparatus for switchable attenuation of a differential input signal from a microphone, and a microphone pre-amplifier comprising the same.

2. Description of the Related Art

It is known to provide switchable attenuation in the signal path between a microphone and a microphone pre-amplifier, possibly forming part of a mixing console, to reduce the level of the input signal by typically 10 to 20 decibels. This is often desirable for very loud sources such as percussion to avoid clipping of the input signal in the pre-amplifier, or to enable the pre-amplifier to be operated in a certain range for creative reasons such as introducing particular kinds of distortion particular to that range of the amplifier.

Such attenuators, which are often referred to as microphone pads, typically only switch in a fixed series resistance. Thus, the level of the input signal immediately drops by a fixed amount, which is equivalent to modulation of the audio signal by a step function. This introduces severe transient distortion, which manifests as a thud or a pop, which can be commercially unacceptable. The attenuator is often switched by means of a relay, and thus whilst it is being switched in the amplifier may be automatically muted to avoid the thud or pop associated therewith.

It is therefore an object of the present invention to provide an improved switchable attenuator for a microphone which does not require the entire input to be muted.

BRIEF SUMMARY OF THE INVENTION

The invention is directed towards apparatus for switchable attenuation of a differential input signal from a microphone. Positive and negative non-attenuating paths are provided that have n- and p-type MOSFETs in back-to-back configurations. Positive and negative attenuating paths are provided that have n- and p-type MOSFETs in back-to-back configurations in combination with an attenuator to provide attenuation. A gate driver applies a drive signal of one polarity to the gates of the n-type MOSFETs in the attenuating paths and the p-type MOSFETs in the non-attenuating paths, and a drive signal of opposite polarity to the gates of the p-type MOSFETs in the attenuating paths and the n-type MOSFETs in the non-attenuating paths.

This means that the state of the MOSFETs is dependent upon the polarities of the drive signals, and thus the input signal may be routed via either the non-attenuating paths or the attenuating paths.

The apparatus may form part of a microphone pre-amplifier, which may be incorporated in a mixing console.

DETAILED DESCRIPTION THE INVENTION

FIG. 1

Figure 1:
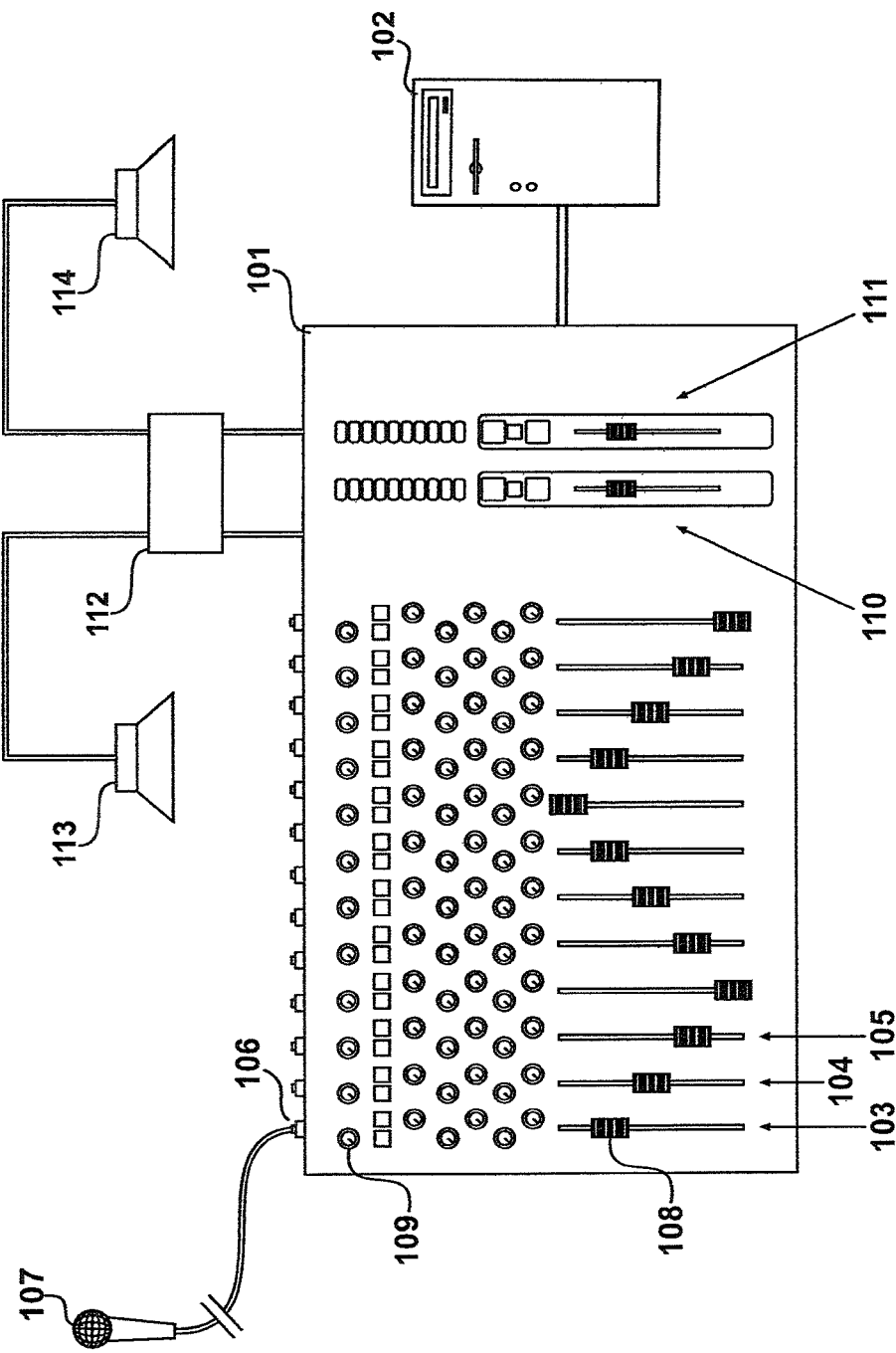
FIG. 1 shows an exemplary audio mixing configuration where the present invention may be used.

An exemplary audio mixing configuration is illustrated in FIG. 1, in which a mixing console 101 is being used to mix numerous channels of audio into one output for recording to a hard disk recording system 102.

The mixing console 101 comprises a number of channel strips such as channel strips 103, 104 and 105. Each of these channel strips, for instance channel strip 103, corresponds to one particular input, such as input 106 which receives an input signal from a microphone 107. The input signal is a differential-mode signal, which is to say the signal is transmitted using two complementary signals of opposite polarity over two conductors. In the illustrated example, each channel strip includes a rotary control such as rotary control 109 to control the gain applied by the channel's microphone pre-amplifier.

Faders, such as fader 108, are also present to control the relative contribution of the channel to the final mix by adjusting the gain of the particular channel's input audio signal. In this example, master faders 110 and 111 are also present which control the contribution of each of two stereo channels to the final mix. In the example shown in FIG. 1, a power amplifier 112 is provided to allow the mix to be monitored by an operator by means of two loudspeakers, 113 and 114. A recording of the final output mix is made by hard disk recording system 102.

Whilst not shown in the Figure, as mentioned previously a degree of pre-amplification is applied to input signals received at each input of the mixing console 101. The degree of gain applied during this process is very much dependent upon the input source, but gain is particularly important when, as illustrated in the Figure, an input signal is received from a microphone. The output of high-quality microphones, in particular due to their high impedances (known in the art as hi-Z) can in many cases only be of the order of between 1 and 10 millivolts. In order to increase the level of this signal to line-level in order for signal processing to take place, a large degree of gain must be applied, sometimes up to 100 decibels.

However, microphones may be required on occasions to pick up sounds that are themselves very high level, and so the mixing console 101 includes a switchable attenuator in each channel according to the present invention to, in the present embodiment, introduce 20 decibels of attenuation prior to the channel's input signal being amplified by its pre-amplifier.

FIG. 2

Figure 2:
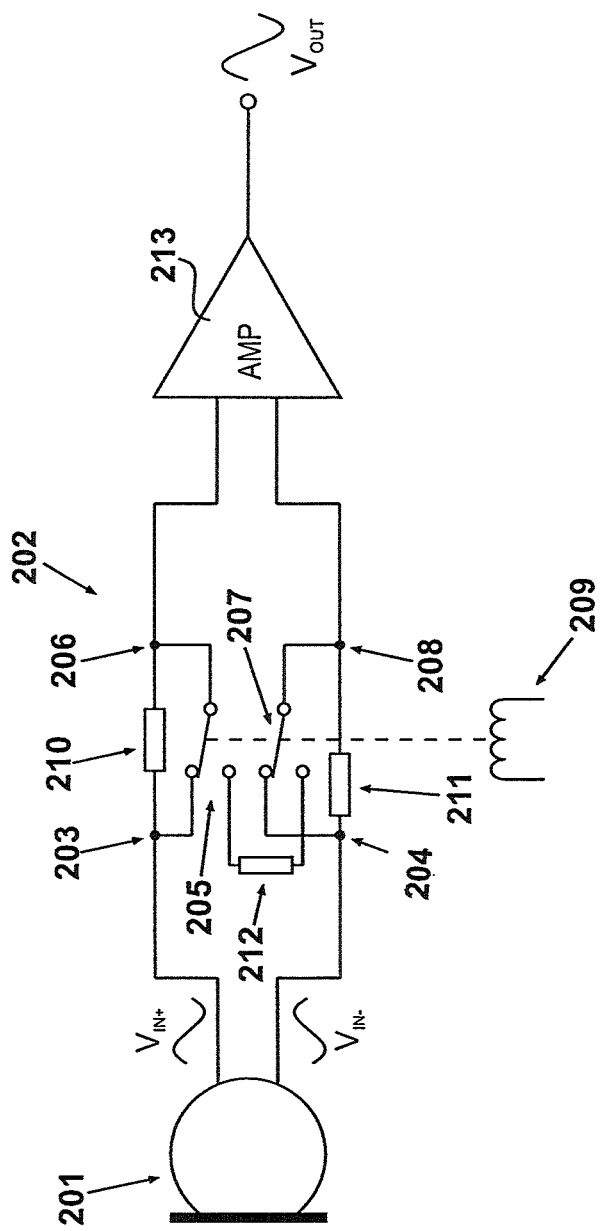
FIG. 2 shows a prior art switchable attenuator.

As described previously, prior art approaches to introducing attenuation prior to amplification have some shortcomings. A prior art switchable attenuator is shown in FIG. 2.

A differential input signal from a microphone 201 is routed via the prior art switchable attenuator, identified generally at 202. The complementary parts $V_{IN+}$ and $V_{IN-}$ of the differential input signal are received at respectively a positive input 203 and a negative input 204. The switchable attenuator 202 includes a first relay 205 in a positive path between positive input 203 and a positive output 206. A second relay is 207 provided in a negative path between negative input 204 and a negative output 208.

The first relay 205 and second relay 207 are mechanically linked so as to switch in unison. Upon activation of the relays, possibly by way of an electromagnet 209, a first resistor 210 in the positive path and a second resistor 211 of equal resistance in the negative path are switched in to the circuit in series, along with a third resistor 212 in parallel. This creates a voltage divider operative to attenuate the input signal from the microphone 201 by an attenuation factor A that is dependent upon the ratio of the value of resistors 210 and 211, to the third resistor 212. On activating the switches 205 and 207, which are typically relays, $V_{IN+}$ and $V_{IN-}$ are attenuated to become $AV_{IN+}$ and $AV_{IN-}$.

The input signal is then presented to the inputs of a microphone pre-amplifier 213 to produce a signal $V_{OUT}$ when the attenuator 202 is inactive, and $AV_{OUT}$ when the attenuator 202 is active (assuming its gain is fixed).

The characteristic thud or pop when the switches are activated is difficult to mitigate against without affecting the audio signal, even if the switching can be aligned with a zero crossing point of the audio signal, as even this introduces distortion. The problem is compounded by the fact that, even using reed relays, there is always actuation-to-actuation variance in the switching time, along with a period where no signal flows as the relay moves between contacts. Thus, timing the operation of the relay precisely and repeatedly is not possible, resulting in distortion.

Further still, this lack of precision and repeatability means that attenuating devices in the prior art switchable attenuator cannot be switched in concert with adjustments further down the signal path, such as changes to the gain of microphone pre-amplifier, for example.

FIG. 3

The present invention therefore proposes use of a different technology to control the switching of a resistance in and out of the signal path, which provides both precision and repeatability in terms of switching time. In an embodiment, this furthermore allows the introduction of an attenuating element into the circuit along with a corresponding increase in the gain of the microphone pre-amplifier, so as to minimise distortion. In another embodiment, it allows the pulse-width modulation of the input signal between an attenuating path and a non-attenuating path so as to provide variable attenuation.

Figure 3:
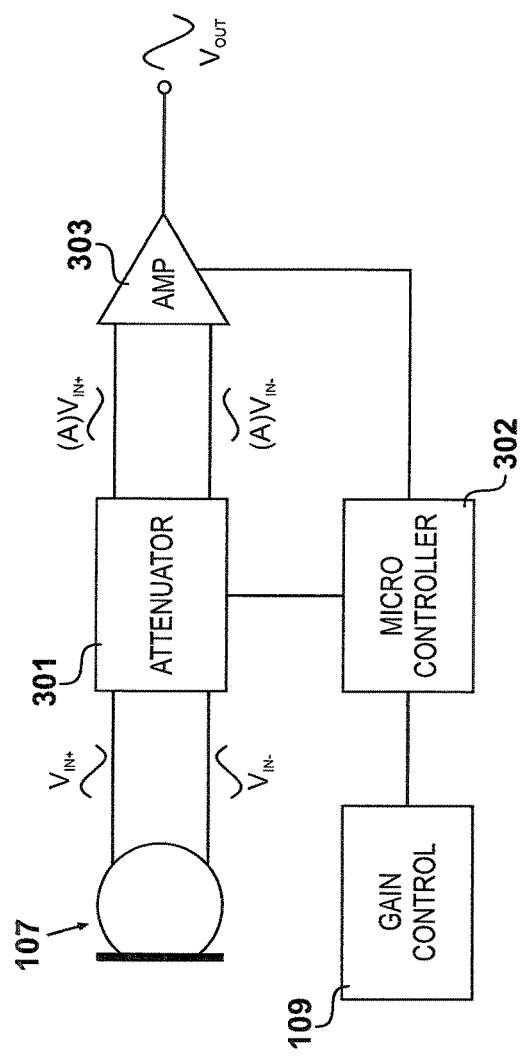
FIG. 3 is a block diagram of the switchable attenuator of the present invention and accompanying devices.

A block diagram of a switchable attenuator of the present invention is shown in FIG. 3, forming part of the mixing console 101 identified in FIG. 1.

The microphone 107 provides a differential input signal to a switchable attenuator 301 according to the present invention, which, when activated, attenuates the two complementary parts $V_{IN+}$ and $V_{IN-}$ by an attenuation factor A to produce an output of $AV_{IN+}$ and $AV_{IN-}$. The switchable attenuator 301 will be described in further detail with reference to FIG. 4. Activation of the switchable attenuator 301 is achieved by a microcontroller 302 of the known type, which in the present example is responsible for sampling the current position of the rotary control 109 for controlling the gain to be applied to the input signal.

The microcontroller 302 is also responsible for controlling the gain of the microphone pre-amplifier 303 for the channel, which amplifies the input signal from the microphone 107 to produce an output signal, $V_{OUT}$.

In the present example, the pre-amplifier 303 is of one of the types disclosed in U.S. Pat. No. 9,257,951, which is assigned to the present applicant. The gain of the pre-amplifier 303 is determined by a digitally controlled attenuator therein. The pre-amplifier 303 and its operation will be described with reference to FIGS. 5 and 6.

In combination, the switchable attenuator 301, the microcontroller 302, and the pre-amplifier 303 are configured to receive via the rotary controller 109 an indication that an operator of the mixing console 101 wishes to reduce the gain of the input signal below a certain point. At this point, the microcontroller 302 activates the switchable attenuator 301, thereby introducing in the present example 20 decibels of attenuation, whilst at the same time altering the attenuation of the digitally controlled attenuator in the pre-amplifier 303 so that the gain of the pre-amplifier 303 is increased by, in the present example, 19.9 decibels. Apart from a slight decrease in the signal to noise ratio, this means that it appears that the gain of the input signal from microphone 107 has only been reduced by 0.1 decibels, which in the mixing console 101, is the standard gain step.

FIG. 4

Figure 4:
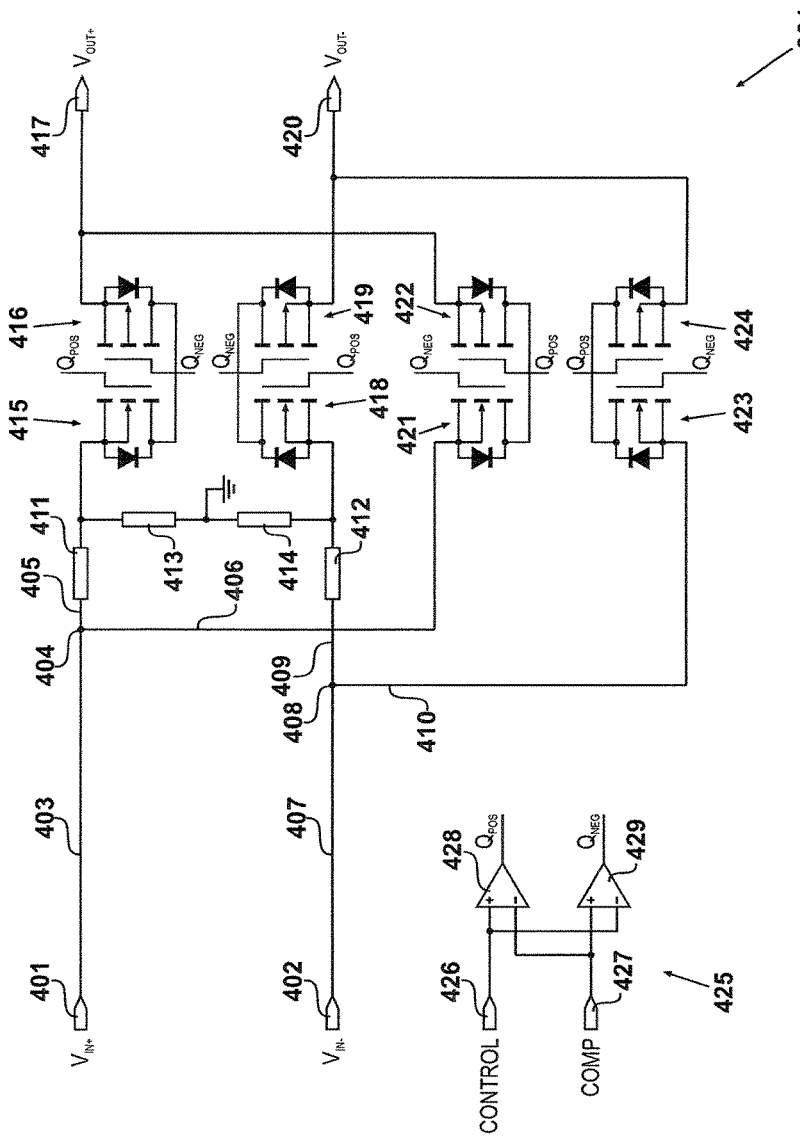
FIG. 4 is a circuit diagram of the switchable attenuator 301.

In order to switch predictably and quickly enough, the switchable attenuator 301 utilises solid-state devices. A circuit diagram of the switchable attenuator 301 is shown in FIG. 4.

A positive part $V_{IN+}$ of the input signal is received at positive input 401, and a negative part $V_{IN-}$ is received at negative input 402.

The positive part $V_{IN+}$ is conducted via a positive path 403 until it reaches a junction 404, where it is split into a positive attenuating path 405 and a positive non-attenuating path 406. Similarly, the negative part $V_{IN-}$ is conducted via negative path 407 until it reaches a junction 408, where it is split into a negative attenuating path 409 and a negative non-attenuating path 410.

Positive attenuating path 405 includes a first resistor 411 and negative attenuating path 409 includes a second resistor 412 of equivalent value. A voltage divider in the positive attenuating path 405 is formed by a third resistor 413 which connects to ground, and another voltage divider is formed by a fourth resistor 414 which connects to ground. In a specific embodiment, the resistors 411 and 412 are 6.8 kiloohm, 0.1 percent resistors, whilst resistors 413 and 414 are 750 ohm, 0.1 percent resistors. This combination of resistance attenuates the input signal by 20 decibels. Other resistance values could of course be used depending upon the degree of attenuation required.

Switching between the attenuating paths and the non-attenuating paths is achieved in the present embodiment by way of a combination of p- and n-type MOSFETs (metal-oxide-semiconductor field-effect transistors).

Thus, in the positive attenuating path 405, a first n-type MOSFET 415 is provided with current initially applied to its source. As shown in the Figure, the MOSFETs include an inherent body diode and so when off only reject for one polarity of signal. The drain of the first n-type MOSFET 415 is therefore connected to the source of a first p-type MOSFET 416, to create a back-to-back configuration. In this way, when the two MOSFETs are off, no current can flow through the positive attenuating path 405. The drain of the first p-type MOSFET 416 is connected to a positive output 417 for the switchable attenuator 301.

A similar configuration is used for the other paths in the circuit.

In the negative attenuating path 409, a second n-type MOSFET 418 receives current at its source, and is configured so that its drain is connected to the source of a second p-type MOSFET 419. The drain of second p-type MOSFET 419 is connected to a negative output 420.

In the positive non-attenuating path 406, a third n-type MOSFET 421 receives current at its source, and is configured so that its drain is connected to the source of a third p-type MOSFET 422. The drain of third p-type MOSFET 422 is connected to the positive output 417.

In the negative non-attenuating path 410, a fourth n-type MOSFET 423 receives current at its source, and is configured so that its drain is connected to the source of a fourth p-type MOSFET 424. The drain of fourth p-type MOSFET 424 is connected to negative output 420.

In the present embodiment, the MOSFETs employed are power MOSFETs typically used for handling significant power levels such as in switched-mode power supplies, rather than un-amplified microphone signals. However, their high commutation speed (around 15 nanoseconds) and low series resistance (around 1 ohm) makes them particularly suitable for the present application. In a specific example, the MOSFETs are Si1029X complementary n- and p-channel 60 volt MOSFETs available from Vishay Intertechnology, Inc. of Malvern, Pa., USA. This particular power MOSFET incorporates an n- and a p-type MOSFET on a single die allowing for streamlined incorporation into a printed circuit board.

The MOSFETs in switchable attenuator 301 are operated by applying voltages to their gates. Switchable attenuator 301 therefore includes a gate driver 425 configured to generate a first drive signal, $Q_{POS}$, and a second drive signal, $Q_{NEG}$. A control signal is received from the microcontroller 302 at a control input 426, which typically will be of the order of millivolts and therefore not of high enough voltage to cause the MOSFETs to turn on or off quickly enough by the charging/discharging of their gate capacitors.

The control signal may be high or low, and is compared to a comparison voltage on input 427. In this embodiment, generation of the first and second drive signals is achieved by providing the control signal to the non-inverting input of a first differential amplifier 428, and to the inverting input of a second differential amplifier 429. The comparison signal is supplied to the inverting input of the first differential amplifier 428, and to the non-inverting input of the second differential amplifier 429. In this way, the first differential amplifier 428 generates the first drive signal, $Q_{POS}$, and the second differential amplifier 429 generates the second drive signal, $Q_{NEG}$. In the present, specific implementation, the differential amplifiers are LM339 differential comparators available from Texas Instruments Inc. of Dallas, Tex., USA.

Thus, in order to control the MOSFETs and activate or inhibit attenuation of the input signal from the microphone, the output of the first differential amplifier 428 which conveys the first drive signal, $Q_{POS}$, is connected to the gates of the first n-type MOSFET 415, the second n-type MOSFET 418, the third p-type MOSFET 422, and the fourth p-type MOSFET 424. The output of the second differential amplifier 429 which conveys the second drive signal, $Q_{NEG}$, is connected to the gates of the first p-type MOSFET 416, the second p-type MOSFET 419, the third n-type MOSFET 421, and the fourth n-type MOSFET 423.

Thus it may be seen that the drive signals $Q_{POS}$ and $Q_{NEG}$ control the state of the MOSFETs in such a way that when the MOSFETs in the positive and negative non-attenuating paths are "on" those in the positive and negative attenuating paths are "off", and vice versa.

In the present embodiment, therefore, when the control signal is high, the switchable attenuator 301 is activated and the input signal is conducted via the positive and negative attenuating paths. When the control signal is low, the opposite condition is achieved and the input signal is conducted via the positive and negative non-attenuating paths.

FIG. 5

Figure 5:
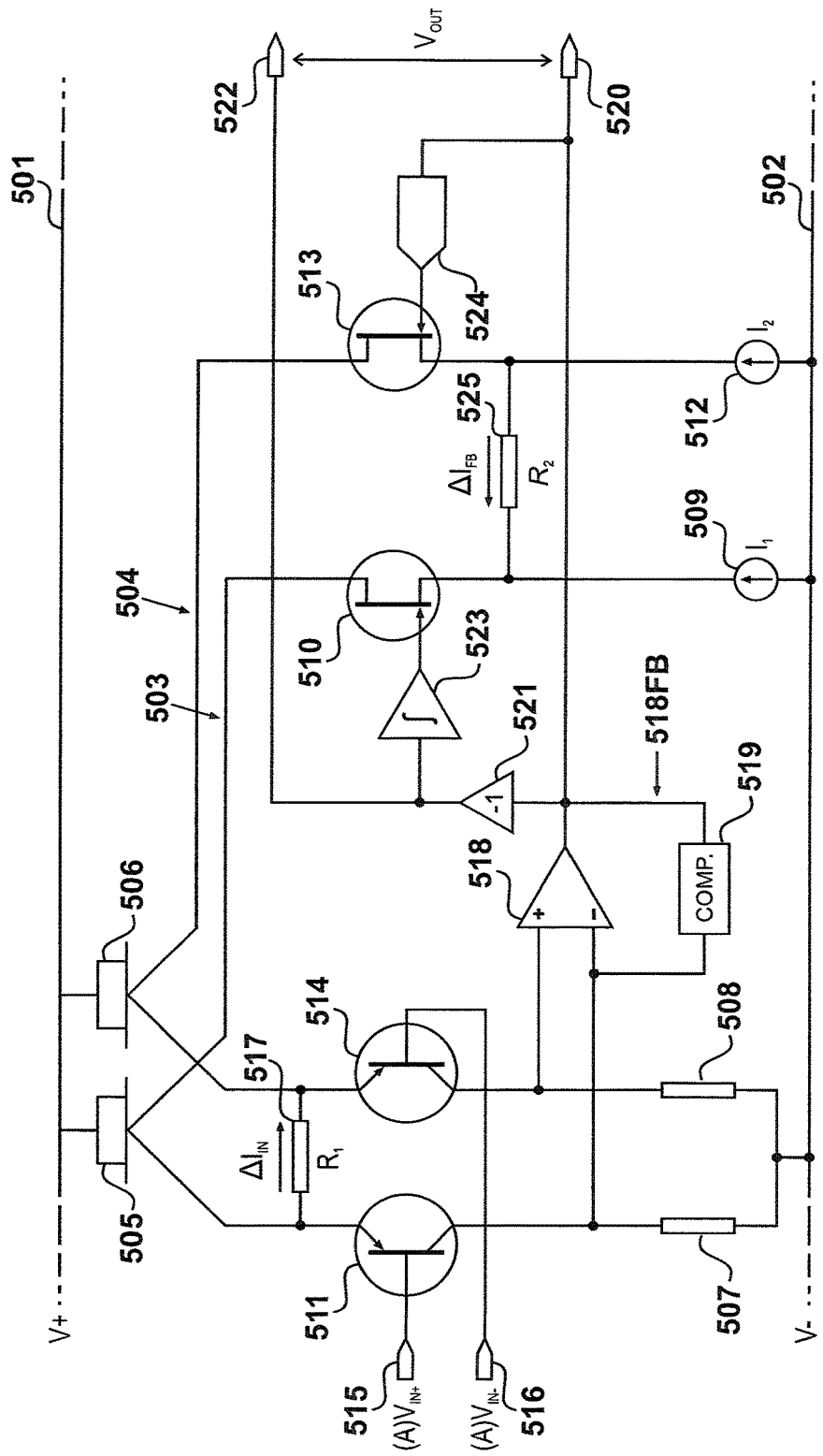
FIG. 5 is a schematic of the microphone pre-amplifier 303 identified in FIG. 3.

A schematic of the microphone pre-amplifier 303 is shown in FIG. 5.

A positive supply rail 501 and a negative supply rail 502 are provided, which, in the present embodiment have a voltage of +15 volts and −15 volts respectively, providing a balance between available dynamic range and power consumption. A first current path 503 and a second current path 504 extend upward from the negative supply rail to a first current mirror 505 and a second current mirror 506. The current mirrors are of the known type and are thus configured to copy the current from one side of the circuit to the other, and maintain current through the current paths regardless of loading in active devices on each side. First current path 503 and second current path 504 then extend downward towards the negative supply rail 502 via two resistors 507 and 508, each having a resistance of around 500 ohms.

From the negative supply rail, first current path 503 includes a first constant current source 509 connected to the source of a first field effect transistor (FET) 510, which in this particular implementation is an n-channel junction FET. The path continues with the drain of first FET 510 being connected, via first current mirror 505, to the emitter of a first bipolar junction transistor (BJT) 511. The collector of first BJT 511 is then connected to resistor 507. In this embodiment the transistors will be recognized as being PNP construction, although it will be appreciated by those skilled in the art that NPN-type components could be used with appropriate modifications to the rest of the circuit being made.

The second current path is substantially similar to the first, having a second constant current source 512 connected to the source of a second FET 513. The drain of second FET 513 is connected, via current mirror 506, to the emitter of a second BJT 514, whose collector is in turn connected to resistor 508.

Input signals themselves from the switchable attenuator 301, are identified as $AV_{IN+}$ and $AV_{IN-}$. They are received at, respectively, input terminals 515 and 516. Input terminal 515 is coupled to the base of BJT 511, whilst input terminal 516 is coupled to the base of BJT 514. Thus, input voltages received via the input terminals control the flow of current through BJTs 511 and 514. The presence of a differential signal on the two inputs results in the current flowing through BJT 511 tending to decrease, and the current flowing through BJT 514 tending to increase. Of course, should an alternative embodiment be constructed utilizing NPN bipolar junction transistors, then the opposite will occur, and so those skilled in the art will appreciate that in such circumstances appropriate measures should be taken to change the polarity of the input terminals.

It will be seen by those skilled in the art that the two BJTs receiving the two complementary parts of the differential signal together form a first differential amplifier, with the input terminals providing inputs for receiving differential input signals. An input-stage shunting resistance 517, having a resistance $R_1$, is also placed between the emitters of BJTs 511 and 514.

The voltage formed at the collector of first BJT 511 (due to the presence of resistor 507) is coupled into the inverting input of a second differential amplifier, provided in this embodiment by an operational amplifier 518 which is configured to provide 100 decibels of gain. It will of course be appreciated that operational amplifier 518 can be configured to operate with alternative (and perhaps variable) levels of gain in dependence upon the particular application of the amplifier structure.

In addition, the voltage formed at the collector of second BJT 514 (due to the presence of resistor 508) is coupled to the non-inverting input of operational amplifier 518, having a negative feedback path 518FB. Thus, operational amplifier 518 amplifies the difference between the voltages developed in first current path 503 and second current path 504 following modulation of the currents therein by BJTs 511 and 514.

In the embodiment illustrated in FIG. 5, the negative feedback path 518FB around operational amplifier 518 is configured to operate as a dominant pole compensator, and thus includes a compensation circuit 519. The role of compensation circuit 519 is to encourage stability of the output stage. In this embodiment, this is achieved by configuring the compensation circuit 519 such that the gain of operational amplifier 518 reduces to 0 decibels before the phase delay it introduces reaches −180 degrees. Compensation circuit 519 therefore includes, in one embodiment, a capacitor that provides a dominant pole in the system, and introduces a reasonable phase margin of, say, 60 degrees. In another embodiment, a gang of switchable capacitors are provided, each having a different capacitance to introduce dominant poles at different frequencies, tuned to particular gain ranges of the entire amplifier structure. This allows the stability of the circuit to be guaranteed at all possible gain levels.

The output of operational amplifier 518 is primarily coupled to a first output terminal 520. The output of operational amplifier 518 is also coupled to a unity gain inverting operational amplifier 521, which serves to invert the signal. The output of the inverting operational amplifier 521, in effect an inverted version of the output from operational amplifier 518, is supplied to a second output terminal 522. Thus, a ground-referenced output voltage $V_{OUT}$ is developed between the output terminals.

In addition to being coupled to output terminal 522, the output of inverting operational amplifier 521 is also provided, via a DC servo 523, to the gate of FET 510.

A digitally controlled attenuator is provided on the other side of the structure, and in the present embodiment is a multiplying digital-to-analog converter (MDAC) 524, which is connected to the gate of FET 513. In this embodiment, the MDAC is a 14-bit part, and thus provides $2^{14}=16384$ attenuation steps. However, it will be appreciated that higher or lower precision parts may be substituted in view of cost constraints or resolution, for example. The MDAC 524 serves to provide attenuation of its input signals, at a degree determined by the provision of a digital word via a control interface. Referring to FIG. 3, the digital word is provided by microcontroller 302. It is important to note that MDAC 524 is capable of switching between any two attenuation levels: it does not need to step through intermediate levels of attenuation.

Referring again to FIG. 5, it will be apparent to those skilled in the art that the configuration of the MDAC in the illustrated circuit is very much dependent upon the type of transistors employed. In this embodiment, due to FETs being used (which control current flowing between their source and drain terminals in response to a voltage being applied to the gate), the MDAC, which alters its output current in response to an input voltage and a pre-set attenuation level, is combined with an operational transimpedance amplifier, thus providing a voltage to the gate of the coupled FET. The precise configuration will be described further with reference to FIG. 6. However, it is also envisaged that in alternative embodiments, FET 510 and FET 513 could be replaced by appropriately selected BJTs. As a BJT alters the current flow between its emitter and collector in response to current flowing from or to its base, then the output of an MDAC can be used unaltered.

Referring again to FIG. 5, a feedback-stage shunting resistance 525, having a resistance $R_2$, is placed between the drains of FET 510 and FET 513. Responsive to a differential signal synthesized from the output of the output stage, the feedback stage of the pre-amplifier 303 modulates currents in first current path 503 and second current path 504, so as to introduce a degree of feedback to the input stage. The degree of feedback introduced is determined by the attenuation of the MDAC 524 present in the feedback stage.

For completeness, a brief overview of the operation of the circuit topology illustrated in FIG. 5 will now be provided. Say a differential input voltage of $V_{IN}$ volts is provided across the input terminals 515 and 516. This differential voltage is supplied to the bases of BJTs 511 and 514 in the input stage differential amplifier. Modifications then occur to the emitter currents of the BJTs—say, for instance, that current from the emitter of BJT 511 increases and current from the emitter of BJT 514 decreases. This characteristic of the transistors means that an attempt is made to impress the input voltage across input-stage shunting resistance 517, resulting in a steering current $\Delta I_{IN}$ (equal to $V_{IN}$ divided by $R_1$) shunting through the resistance. It will be immediately apparent that any common-mode voltage presented to the input terminals 515 and 516 will be completely rejected, as there is simply no forward common-mode path for such voltages to take. If common-mode voltages are present, they will adjust the base voltages of BJTs 511 and 514, but at an equivalent level and in the same sense in terms of polarity. Thus, no current will shunt across the resistance, and no output signal will, in turn, be generated by operational amplifier 518.

In any event, unchecked, current will flow from first current path 503 to second current path 504, which will lead to changes to the collector currents of BJTs 511 and 514, and a subsequent large differential voltage being developed across the inputs to operational amplifier 518. This will in turn lead to a vast and uncontrolled level of amplification due to the high gain of operational amplifier 518, which would eventually become saturated due to the maximum amount of voltage supplied by voltage rails 501 and 502. Thus, feedback must be provided to return the emitter currents of BJTs 511 and 514 towards a balanced condition, with just enough voltage drop across the input-stage shunting resistance to cause the output of operational amplifier 518 to be such that the feedback can continue to be produced.

Being equal but opposite voltages, the voltages applied to the gates of the FETs 510 and 513 result in equal and opposite modifications to the drain currents of the FETs. This results in the emergence of a similar condition to that in the input stage, in that a voltage of level $V_{FB}$ (equal to $V_{OUT}$) is impressed across feedback-stage shunting resistance 525 (having resistance $R_2$), resulting in a current of magnitude $\Delta I_{FB}$ (equal to $V_{OUT}$ divided by $R_2$) flowing therethrough. However, due to the polarity of the voltages applied to the gates of the FETs, the steering current $\Delta I_{FB}$ shunts in the opposite direction to the steering current through input-stage shunting resistance 517. This has the effect of rebalancing the circuit, as current mirrors 505 and 506 copy the current flowing from the drains to the sources of FETs 510 and 513 to the emitters of the BJTs 511 and 514 through the respective current paths.

In order for this current balancing to control the collector currents of BJTs 511 and 514 at a satisfactory level, the feedback stage steering current $\Delta I_{FB}$ is effectively equal to the input steering current $\Delta I_{IN}$, save for a slight difference that is enough to cause a voltage drop across the input-stage shunting resistance 517 that will, in turn, be amplified by operational amplifier 518 to provide an output signal $V_{OUT}$ at a sufficient level to cause the generation of the feedback stage steering current $\Delta I_{FB}$.

Thus, the gain G of the amplifier structure as a whole ($V_{OUT}$ divided by $V_{IN}$) can be shown to be equal to the ratio of resistances provided by feedback-stage shunting resistance 525 and input-stage shunting resistance 517, or $R_2$ divided by $R_1$, assuming no attenuation by MDAC 524 in the feedback stage. However, should the MDAC's attenuation be increased, then the voltage supplied to the gate of FET 513 will decrease in magnitude. This will in turn result in a reduction in the voltage across feedback-stage shunting resistance 525, and as the degree of resistance $R_2$ of feedback-stage shunting resistance 525 remains fixed, a corresponding reduction in the amount of current shunting therethrough. Thus, the level of current that shunts across input-stage shunting resistance 517 will tend to increase, which in turn will result in the manifestation of a larger difference in voltage at the inputs of operational amplifier 518, giving a more highly amplified output signal $V_{OUT}$.

In effect, therefore, the gain of the entire circuits increases at a degree determined by the attenuation provided by the MDAC 524. The overall gain of the amplifier, G, can therefore be expressed as being proportional to the value of the resistance $R_1$ provided by feedback-stage shunting resistance 525 multiplied by an attenuation variable K provided by the MDAC 524, divided by the resistance $R_2$ provided by input-stage shunting resistance 517, where K ranges between 1 and $2^N$, with 1 being the lowest available attenuation provided by the MDAC, and $2^N$ being the number of attenuation steps available.

FIG. 6

As previously described with reference to FIGS. 5 and 6, the term digitally controlled attenuator as used herein is used to generally refer to a circuit element configured to receive an indication via a control interface of a selected attenuation level. The indication generally takes the form of a digital word, i.e. a group of bits understood as an instruction by the digitally controlled attenuator to adopt a corresponding attenuation level.

The digitally controlled attenuator referred to in FIG. 5 interfaces with field effect transistors. As described previously, the present embodiment uses an MDAC, which, as mentioned previously, receives an input voltage and, based on its attenuation, output a current. Thus, extra capability must be provided to convert this current into a voltage such that it can control the gate of the FET.

Figure 6:
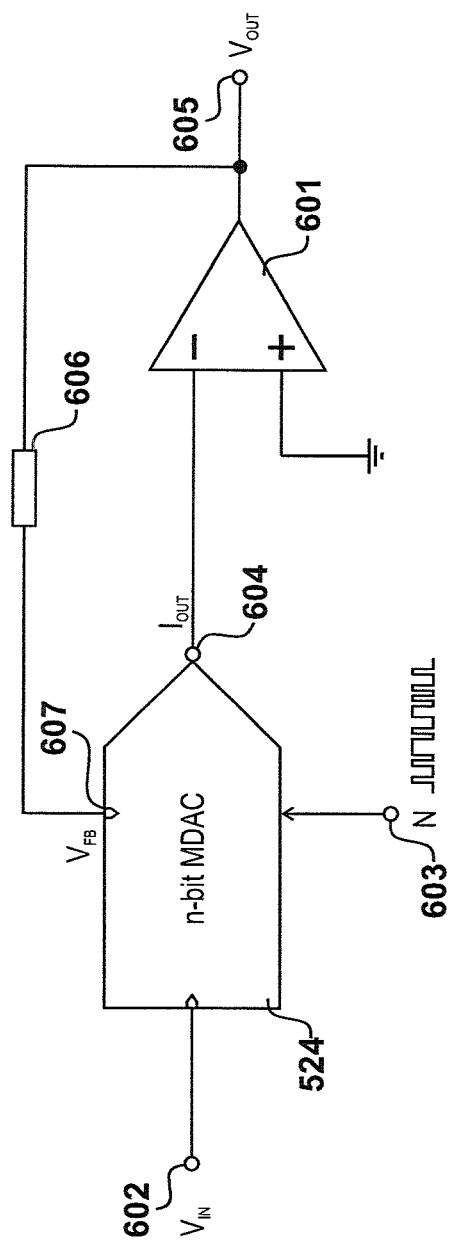
FIG. 6 is a schematic of the configuration of the MDAC 524 forming part of the microphone pre-amplifier 303.

Such an approach is illustrated in FIG. 6, where MDAC 524 is shown in greater detail with its supporting circuit.

An operational amplifier 601 is provided at the output of the MDAC 524 and is configured to operate as a current-to-voltage converter, i.e. an operational transimpedance amplifier. MDAC 524 includes an input terminal 602 at which an input reference voltage is received. Referring to FIG. 5, the reference voltage is the output of operational amplifier 518. Referring again to FIG. 6, a control interface 603 is present as well, and receives from the microcontroller 302 a digital word identifying a value N for the desired level of attenuation to be adopted by the MDAC. Output current is supplied from an output 604 in MDAC 524 to the inverting input of operational amplifier 601, whose non-inverting input is coupled to circuit ground. The output of operational amplifier 601 is provided to an output terminal 605, and is also coupled, via a feedback resistor 606, to a feedback input 607 in MDAC 524 to improve stability. The overall "gain" of the DAC system shown in FIG. 6 (provided by the combination of MDAC 524 and operational amplifier 601) can be shown to be equal to the value N supplied to control interface 603 divided by $2^{N-1}$. So, for instance, if a digital word is provided to MDAC 524 corresponding to a value of N of 8192, and MDAC 524 is a 14-bit part, the gain will be one half.

FIG. 7

Figure 7:
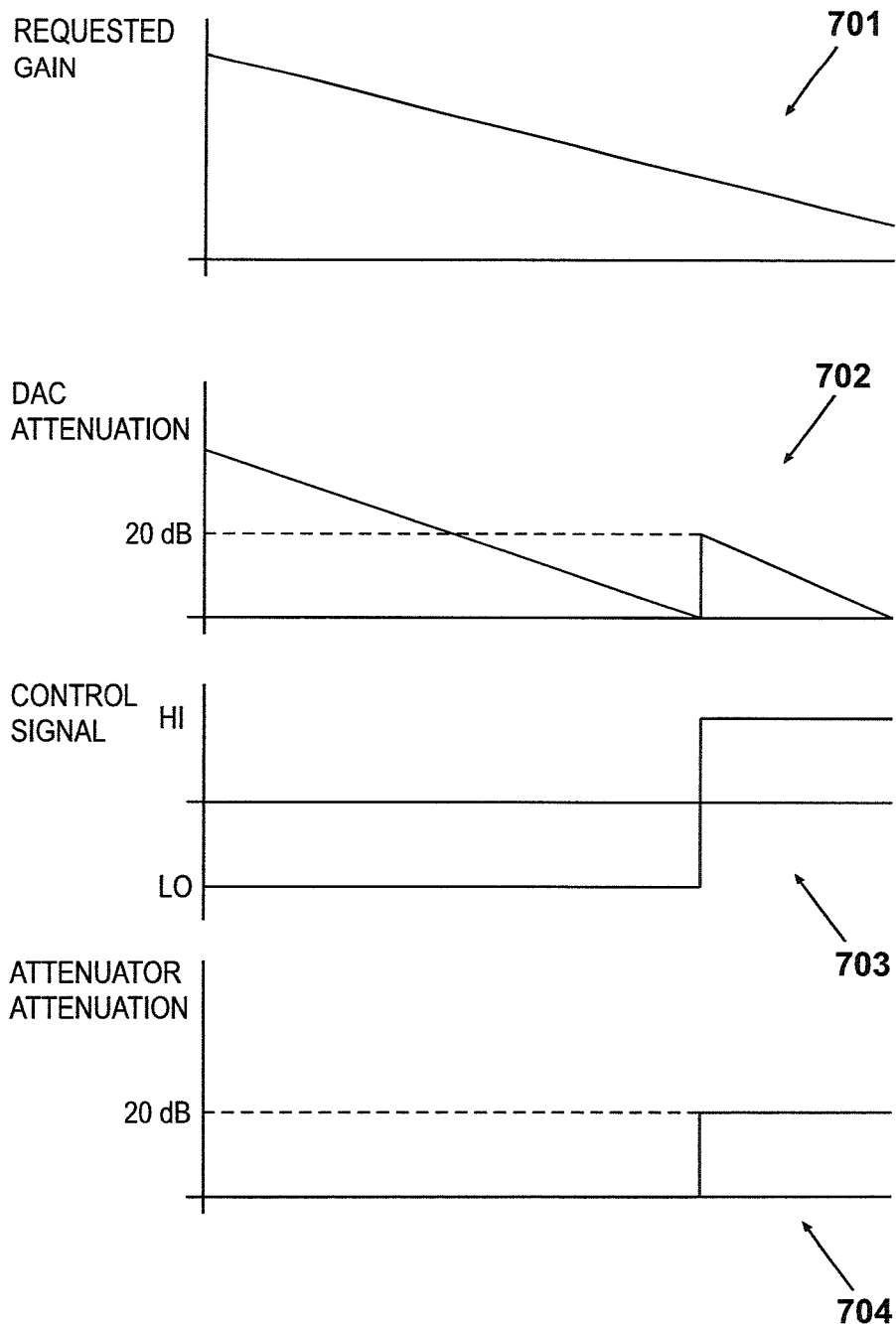
FIG. 7 shows plots of the requested gain level, and changes made to the switchable attenuator 301 and the microphone pre-amplifier 303 to achieve the requested changes in gain.

An operational plot of a requested gain level, and the corresponding changes to the switchable attenuator 301 and the microphone pre-amplifier 303 is shown in FIG. 7.

Plot 701 identifies a requested gain level, controlled by rotary control 109. In this example, the requested gain level undergoes a linear reduction from a high to a low level over a period of time.

In order to satisfy the request, the attenuation provided by, in the present example, MDAC 524 is gradually decreased to zero, until the microphone pre-amplifier 303 applies the lowest level of gain it can. This is shown in plot 702. At this point, as shown in plot 703, the control signal from microcontroller 302 for the gate driver 425 switches from a low to a high value, so as to route the input signal through the attenuating paths 405 and 409. This results in, as shown in plot 704, an increase in the attenuation of the switchable attenuator 301 of 20 decibels. At the same time, the attenuation of the MDAC 524 is adjusted by 19.9 decibels so that the gain of the microphone pre-amplifier 303 is increased by 19.9 decibels. Further reductions in the requested gain level are achieved by again continuing to gradually reduce the attenuation of MDAC 524.

FIG. 8

Figure 8:
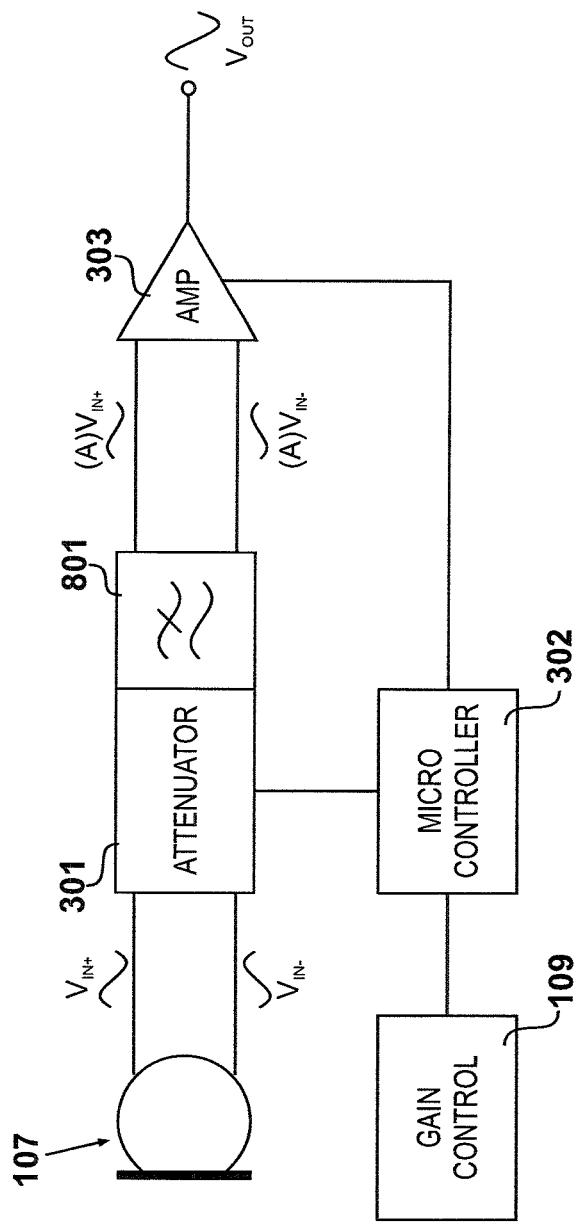
FIG. 8 is a block diagram of an alternative arrangement of the switchable attenuator 301, in which it is combined with a low pass filter 801.

An alternative embodiment of the present invention is shown in FIG. 8 in block diagram form.

In this embodiment, the switchable attenuator 301 is combined with a low pass filter 801, the layout of which will be described with reference to FIG. 9. In this embodiment, the microcontroller 302 is configured to switch the MOSFETs in the switchable attenuator 301 at a very high frequency (i.e. above the audible frequency range) so as to provide variable attenuation of the input signal from the microphone 107. In an alternative embodiment, the low pass filter could be omitted, with appropriate modifications made to the microphone pre-amplifier 303 itself to filter out ultrasonics, or alternatively relying on downstream digital-to-analog converters to reject said ultrasonics.

In a specific embodiment, the microcontroller 302 applies a switching waveform to the gate driver 425 having a frequency of 1 megahertz. This is possible due to the use of MOSFETs, and the response of power MOSFETs is particularly beneficial in this application. The duty cycle of the switching waveform may then be varied between 0 and 100 percent so as to allow control of the degree of attenuation applied to the signal from microphone 107.

FIG. 9

Figure 9:
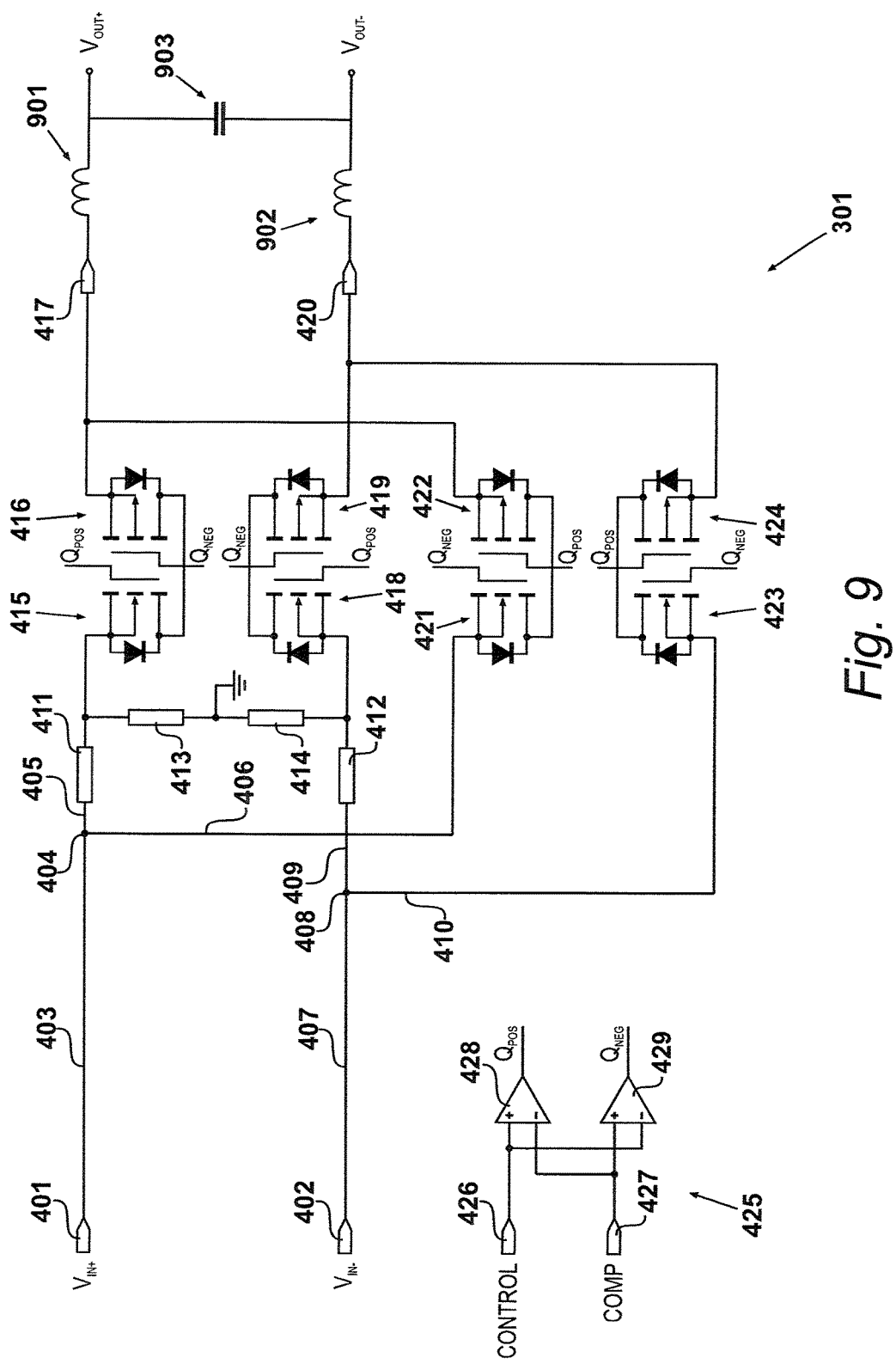
FIG. 9 is a schematic of the switchable attenuator 301 combined with the low pass filter 801.

A diagram of the switchable attenuator 301 in combination with the low pass filter 801 is shown in FIG. 9.

The low pass filter 801 comprises in the present embodiment a first inductor 901 at the positive output 417 of the switchable attenuator 301, and a second inductor 902 at the negative output 420. A capacitor 903 is placed across the inductors so as to form, in this embodiment, a passive, second order low pass filter. Use of a passive design is possible due to the high frequency of switching capability provided by the MOSFETs in the switchable attenuator 301, which relax the requirements in terms of the attenuation of the filter. Inductors are used in the present embodiment due to their low resistance and low noise.

FIG. 10

Figure 10:
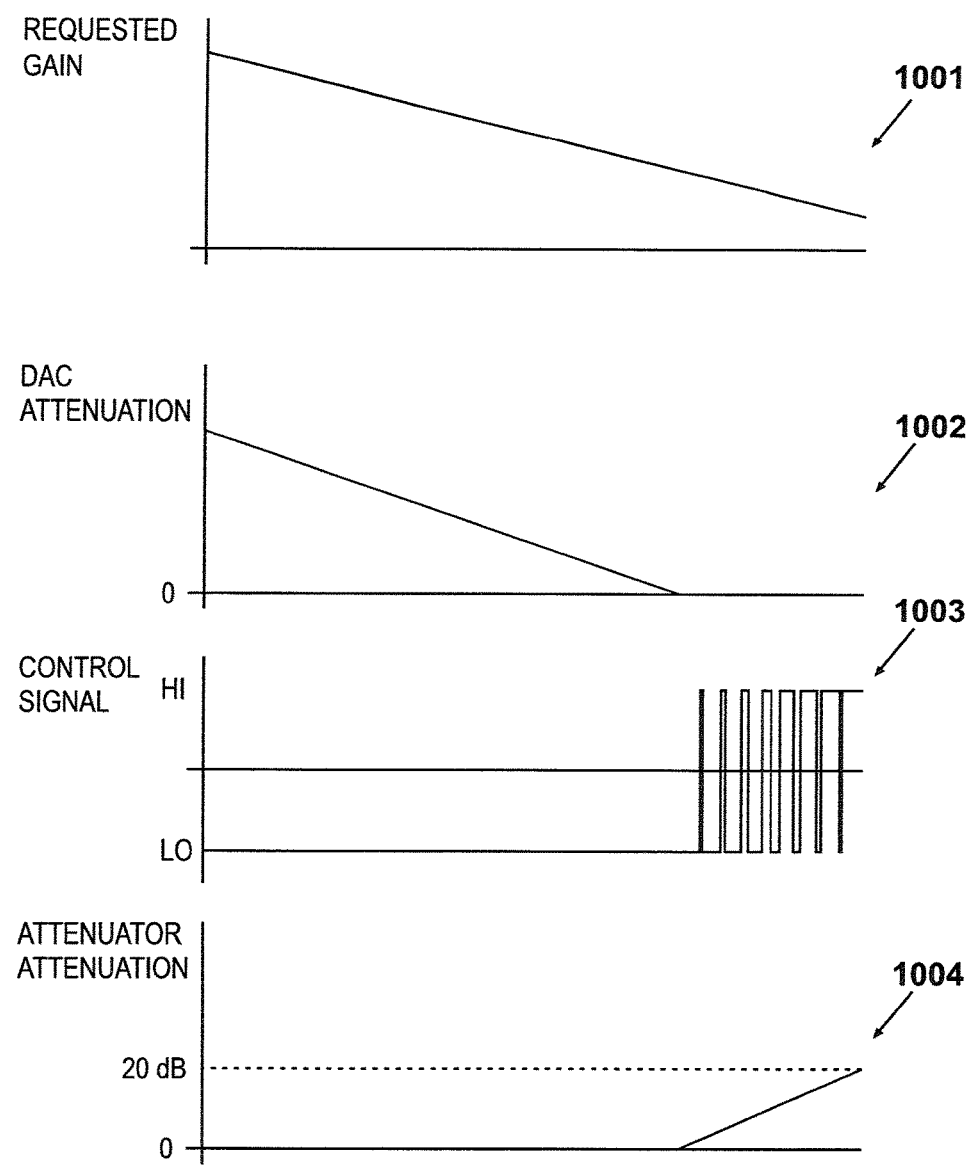
FIG. 10 shows plots of a requested gain level, and the use of pulse width modulation of the switchable attenuator 301 to give variable attenuation.

An operational plot of a requested gain level, and the corresponding changes to the switchable attenuator 301 and the microphone pre-amplifier 303 according to this second embodiment of the present invention is shown in FIG. 10.

Plot 1001 identifies a requested gain level, controlled by rotary control 109. In this example, as in plot 701, the requested gain level undergoes a linear reduction from a high to a low level over a period of time.

In order to satisfy the request, the attenuation provided by, in the present example, MDAC 524 is gradually decreased to zero, until the microphone pre-amplifier 303 applies the lowest level of gain it can. This is shown in plot 1002. Unlike in plot 702, however, the attenuation of the MDAC 524 remains at zero in this embodiment.

At this point, as shown in plot 1003, the control signal from microcontroller 302 for the gate driver 425 begins to switch from a low to a high value using pulse width modulation at a very high, ultrasonic frequency. As described previously, in an embodiment the frequency is 1 megahertz. Initially, the duty cycle of the waveform is in favour of the low value, and so the overall attenuation of the input signal by the switchable attenuator 303 following low pass filtering is small.

However, as the requested gain level continues to drop, the duty cycle is adjusted by the microcontroller 302 such that the high state begins to be favoured, thereby increasing the overall attenuation by the switchable attenuator 303. This continues until the control signal is permanently high, i.e. the duty cycle can be considered to be 100 percent to the high state, and the maximum attenuation of 20 decibels is achieved as shown in plot 1004.

I claim:

1. Apparatus for switchable attenuation of a differential input signal from a microphone, comprising:
   a positive attenuating path including a first n-type MOSFET having a drain connected to a source of a first p-type MOSFET;
   a negative attenuating path including a second n-type MOSFET having a drain connected to a source of a second p-type MOSFET;
   an attenuator to provide attenuation in the positive and negative attenuating paths;
   a positive non-attenuating path including a third n-type MOSFET having a drain connected to a source of a third p-type MOSFET;
   a negative non-attenuating path including a fourth n-type MOSFET having a drain connected to a source of a fourth p-type MOSFET; and
   a gate driver configured to:
   apply a first drive signal to a respective gate of each of the first n-type MOSFET, the second n-type MOSFET, the third p-type MOSFET, and the fourth p-type MOSFET, and
   apply a second drive signal of opposite polarity to the first drive signal to a respective gate of each of the first p-type MOSFET, the second p-type MOSFET, the third n-type MOSFET, and the fourth n-type MOSFET.

2. Apparatus according to claim 1, in which the positive attenuating path includes a first voltage divider and the negative attenuating path includes a second voltage divider, to attenuate the signal from the microphone.

3. Apparatus according to claim 2, in which the first voltage divider and the second voltage divider are configured to introduce 20 decibels of attenuation.

4. Apparatus according to claim 1, in which each MOSFET is a power MOSFET.

5. Apparatus according to claim 1, in which the gate driver comprises a first differential amplifier for generating the first drive signal and a second differential amplifier for generating the second drive signal.

6. Apparatus according to claim 5, further comprising a controller connected to and configured to supply a control waveform to a non-inverting input of the first differential amplifier to generate the first drive signal, and to an inverting input of the second differential amplifier to generate the second drive signal.

7. Apparatus according to claim 6, in which the controller is configured to generate the control waveform at a rate above an audible frequency range.

8. Apparatus according to claim 7, further comprising a low pass filter connected to a drain of the first p-type MOSFET, the second p-type MOSFET, the third p-type MOSFET and the fourth p-type MOSFET.

9. Apparatus according to claim 8, in which the low pass filter is an inductor-capacitor second-order low pass filter.

10. Apparatus according to claim 6, in which the control waveform has a duty cycle which is variable between 0 and 100 percent so as to provide variable attenuation of the input signal from the microphone.

11. A microphone pre-amplifier for amplifying a differential input signal received from a microphone, comprising:
    an attenuation stage including the apparatus of claim 1;
    an amplification stage having a gain determined by a digitally-controllable attenuator having a level of attenuation; and
    a controller connected to the digitally controllable attenuator and the gate driver;
    wherein the controller is configured to reduce a level of an output signal from the microphone pre-amplifier by:
    controlling the gate driver to turn on the first n-type MOSFET, the second n-type MOSFET, the third p-type MOSFET and the fourth p-type MOSFET of the apparatus of claim 1, and
    controlling the gate driver to turn off the first p-type MOSFET, the second p-type MOSFET, the third n-type MOSFET and the fourth n-type MOSFET of the apparatus of claim 1, and
    adjusting the gain of the amplification stage using the digitally-controllable attenuator to compensate for attenuation introduced by the attenuation stage.

12. A microphone pre-amplifier according to claim 11, in which the level of the output signal is reduced by 0.1 decibels to minimise distortion.

13. A mixing console including the apparatus of claim 1.

* * * * *